United States Patent [19]

Ban et al.

[11] Patent Number: 4,885,260
[45] Date of Patent: Dec. 5, 1989

[54] METHOD OF LASER ENHANCED VAPOR PHASE GROWTH FOR COMPOUND SEMICONDUCTOR

[75] Inventors: Yuzaburo Ban, Osaka; Masaya Manno, Kadoma; Minoru Kubo, Katano; Mototsugu Morisaki, Osaka; Mototsugu Ogura, Takaichi, all of Japan

[73] Assignee: Matsushita Electric Industrial Co., Ltd., Osaka, Japan

[21] Appl. No.: 156,525

[22] Filed: Feb. 16, 1988

[30] Foreign Application Priority Data

| Feb. 17, 1987 | [JP] | Japan | 62-33804 |
| Feb. 18, 1987 | [JP] | Japan | 62-35041 |
| Mar. 17, 1987 | [JP] | Japan | 62-61547 |
| Jun. 22, 1987 | [JP] | Japan | 62-154663 |

[51] Int. Cl.$^4$ ............ H01L 21/20; H01L 21/26
[52] U.S. Cl. ............ 437/81; 148/DIG. 48; 148/DIG. 65; 148/DIG. 72; 148/DIG. 94; 156/613; 427/531; 437/82; 437/110; 437/112; 437/133; 437/173; 437/936; 437/942; 437/963
[58] Field of Search ............ 148/DIG. 6, DIG. 21, 148/DIG. 48, DIG. 56, DIG. 65, DIG. 72, DIG. 94, DIG. 110, DIG. 149, DIG. 169; 156/610–614; 427/53.1, 54.1; 437/19, 81, 107, 82, 108, 110, 111, 112, 126, 132, 133, 173, 936, 942, 949, 963

[56] References Cited

U.S. PATENT DOCUMENTS

| 4,081,313 | 3/1978 | McNeilly et al. | 156/610 |
| 4,533,410 | 8/1985 | Ogura et al. | 156/612 |
| 4,588,451 | 5/1986 | Vernon | 437/126 |
| 4,632,711 | 12/1986 | Fujita et al. | 437/133 |
| 4,664,743 | 5/1987 | Moss et al. | 437/105 |
| 4,716,130 | 12/1987 | Johnston, Jr. et al. | 437/104 |
| 4,729,968 | 3/1988 | Karlicek, Jr. | 437/81 |
| 4,767,494 | 8/1988 | Kobayashi et al. | 156/613 |

OTHER PUBLICATIONS

Nishizawa et al., "Molecular Layer Epitaxy", J. Electrochem. Soc., 132, May 1985, pp. 1197–1200.

Nishizawa et al., "Photostimulated Molecular Layer Epitaxy", J. Vac. Sci. Technol., A4(3), May/Jun. 1986, pp. 706–710.

Doi et al., "Stepwise . . . by Switched Laser Metalorganic Vapor Phase Epitaxy", Appl. Phys. Lett., 49(13), 29 Sep. 1986, pp. 785–787.

Bedair et al., Appl. Phys. Lett., 48(2), 13 Jan. 1986, pp. 174–176.

Balk et al., "Ultraviolet Induced Metal–Organic Chemical Vapor Deposition Growth of GaAs," J. Voc. Sci. Technol., A4(3) May/Jun. 1986, pp. 711–715.

Primary Examiner—Brian E. Hearn
Assistant Examiner—William Bunch
Attorney, Agent, or Firm—Wenderoth, Lind & Ponack

[57] ABSTRACT

Disclosed is a vapor phase growth method of compound semiconductor in which source gases are introduced into an epitaxial growth reactor at fixed feed rates, the substrate surface is irradiated with light, and the light irradiation is turned on and off, or the intensity of light irradiation is increased or decreased, so that an epitaxial layer structure changes in the composition, and the carrier concentration and conductivity type abruptly or continuously change in the growth film in the direction of the thickness.

4 Claims, 8 Drawing Sheets

Band Gap Energy

Band Gap Energy

METHOD OF LASER ENHANCED VAPOR PHASE GROWTH FOR COMPOUND SEMICONDUCTOR

BACKGROUND OF THE INVENTION

This invention relates to method of vapor phase growth for a compound semiconductor.

Recently, vapor phase epitaxial growth methods of III-V group and II-VI group compound semiconductors, especially the metal organic vapor phase epitaxy (MOVPE), hydride vapor phase epitaxy, and chloride vapor phase epitaxy are attracting a wide attention from the aspects of large area epitaxy, mass producibility, controllability of film thickness and composition, and others, and are intensively researched and developed by many manufacturers.

In particular, the production of multi-layer thin film structures of compound semiconductors is drawing a keen interest from the viewpoint of device application. For example, the quantum well structure as shown in FIG. 8A, and the growth method of epitaxial layers having band gap energy which varies continuously in the direction of the film thickness is being energetically researched and developed. In FIGS. 8A and 8B, numeral 201 denotes a GaAs substrate, 202 is a GaAs layer, and 203, 204 are AlGaAs layers.

Conventionally, compound semiconductors having a multi-layer thin film structure represented by the quantum well structure have been grown by molecular beam epitaxy (MBE) methods or by metal organic vapor phase epitaxy (MOVPE) method. Below are explained the AlGaAs/GaAs quantum well structure and AlGaAs layer with a continuously varying Al composition ratio according to the conventional MOVPE method.

FIG. 7 is a gas piping model diagram of a vapor phase growth apparatus used when fabricating a GaAs/AlGaAs multi-layer thin film structure by an MOVPE method, in which numeral 1 is an epitaxial growth reactor, 2 is a substrate, 3 is a carbon-made susceptor, 4 is an rf-coil and 5 is a thermocouple, 61, 62, represent organic metals as source materials for Al, Ga and p-type impurity Zn, that is, trimethyl aluminum [TMA: $(CH_3)_3Al$], trimethyl gallium [TMG: $(CH_3)_3Ga$], dimethyl zinc [DMZ: $(CH_3)_2ZN$]; 71, 72 ae hydrogenated gases as source materials for As and N-type impurity Se, that is, arsine ($AsH_3$), hydrogen selenide ($H_2Se$); 81, 82, 83, 84, 85 are mass flow controllers for controlling the flow rate of TMA, TMG, DMZ, $AsH_3$, $H_2Se$; 91, 92, 93, 94, 95 are three-way valves for selectively introducing source gases 61, 62, 63, 71, 72 into either epitaxial growth reactor 1 or exhaust system 120; 100 is a valve; 110 is a mass flow controller; 120 is an exhaust system, and 130 is a scrubber for an exhaust gas.

When growing a quantum well structure shown in FIG. 8A by using this apparatus, first the $H_2$ flow rate of each line is adjusted by the mass flow controller 110, and while passing the source gases into the exhaust system 120 by the operaton of three-way valves 91, 92, 93, the flow rates of TMA, TMG, $AsH_3$ are adjusted by mass flow controllers 81, 82, 84 to make stationary, and then by the operation of three-way valves 92, 94, TMG and $AsH_3$ are introduced into the epitaxial growth reactor 1 to grow a GaAs layer in the first place. Next, by the operation of the three-way valve 91, TMA is further led into the reactor 1 to grow an AlGaAs layer. In succession, by the operation of the three-way valve 91, the supply of TMA is stopped to grow a GaAs layer. In this way, by the operation of the three-way valve 91, one can supply and stop the introduction of TMA into the epitaxial growth reactor 1 repeatedly as many times as required during a specified period, so that a quantum well structure may be produced.

However, in the quantum well structure formed by such method, that is, by changing the source gases, it is difficult to vary the Al composition ratio sharply at the interface of the GaAs layer and AlGaAs layer, and a transient layer with an Al composition varying in the interface is formed with Al being mixed in the GaAs layer. This means a quantum well structure cannot formed with satisfactory reproducibility with the apparaus as designed. This is because TMA is left over in the piping and epitaxial growth reactor when the supply of TMA is stopped by the three-way valve (due to a so-called memory effect), and desired composition changes are not obtained with satisfactory reproducibility.

When growing an AlGaAs layer of which the Al composition ratio is continuously varied in the direction of the thickness of the growth film as shown in FIG. 8B, same as in the case of said growth of a quantum well structure, first the $H_2$ flow rate of each line is adjusted by the mass flow controller 110, and while passing the source gases to the exhaust system 120 by the operation of three-way valves 91, 92, 94, the flow rates of TMA, TMG, $AsH_3$ are adjusted by the mass flow controllers 81, 82, 84 to make stationary, and TMG, TMA and $AsH_3$ are introduced into the epitaxial growth reactor by the operation of the three-way valves 91, 92, 94, thereby starting growth. At this time, the flow of source gas TMA of Al is gradually increased by the mass flow controller 81, and the AlGaAs layer is grown so as to increase the Al composition ratio in the growth film thicknesswise direction.

In such methods, however, since the flow rate of the source gases is gradually varied, the whole flow rate in the epitaxial growth reactor is changed, and since organic metals such as TMA are generally supplied by bubbling to feed source gases, the flow rate change in the mass flow controller is not instantly reflected by the change in the supply quantity of TMA. As a result, it was difficult to form a structure of satisfactory reproducibility by the conventional design of the epitaxial growth reactor.

SUMMARY OF THE INVENTION

This invention is intended to present a multi-layer thin film structure possessing steep changes in the composition, carrier concentration, and conductivity type, and an epitaxial layer possessing continuous changes in the composition and carrier concentration, by solving the above-discussed conventional problems.

In order to achieve the above object, in the epitaxial growth process of a multi-layer thin film structure or a structure having continuous changes in the composition and carrier concentration in the growth film thicknesswise direction, control is not effected by changeover of source gases or change in supply volume of source gases, but the substrate surface is irradiated with light while the source gases are fixed at specified flow rates, and by on/off switching of the light irradiation or increase or decrease of the light intensity, it is designed to form an epitaxial layer structure with the composition, carrier concentration and conductivity type varied abruptly or continuously in the growth film thickness-wise direction.

That is, when the substrate surface is irradiated with light in the process of epitaxial growth by a vapor phase growth method, a photodecomposition of the source gases occurs due to a photochemical reaction, and since the efficiency of the photodecomposition varies with each source gas, the incorporation efficiency of each constituent element to be taken into the epitaxial layer from each source gas differs whether light irradiation is conducted or not. This change brings about differences in the composition, carrier concentration, and conductivity type, and because of change by light, a abrupt change is possible at the interface between the light irradiated layer and non-irradiated layer. Besides, since the quantity of photodecomposition of the source gas is approximately proportional to the light intensity, it is possible to grow an epitaxial layer continuously varied in the composition and carrier concentration by increase or decrease of the light intensity.

While the novel features of the invention are set forth with particularity in the appended claims, the invention, both as to organization and content, will be better understood and appreciated, along with other objects and features thereof, from the following detailed description taken in conjunction with the drawings.

BRIEF DESCRIPION OF THE DRAWINGS

DETAILED DESCRIPTION OF THE INVENTION

Figure 1:
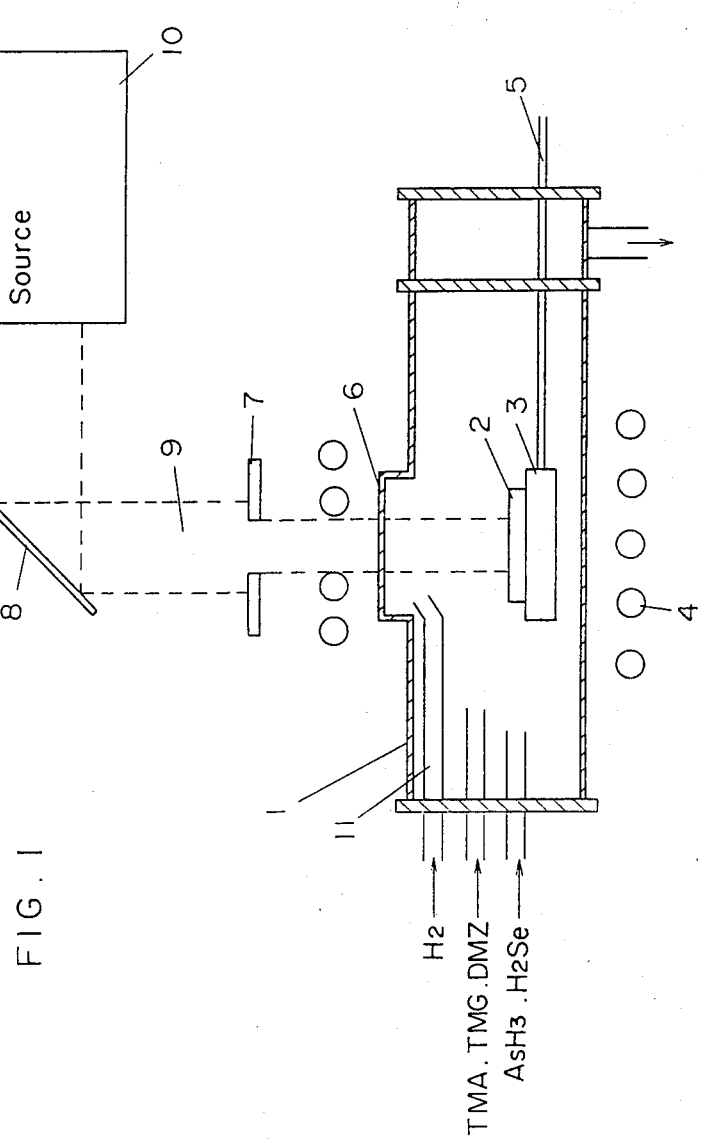
FIG. 1 shows schematically the epitaxial growth reactor of a photo-assisted MOVPE apparatus used in the fabrication of various compound semiconductor device structures in the embodiments of this invention.
Figure 7:
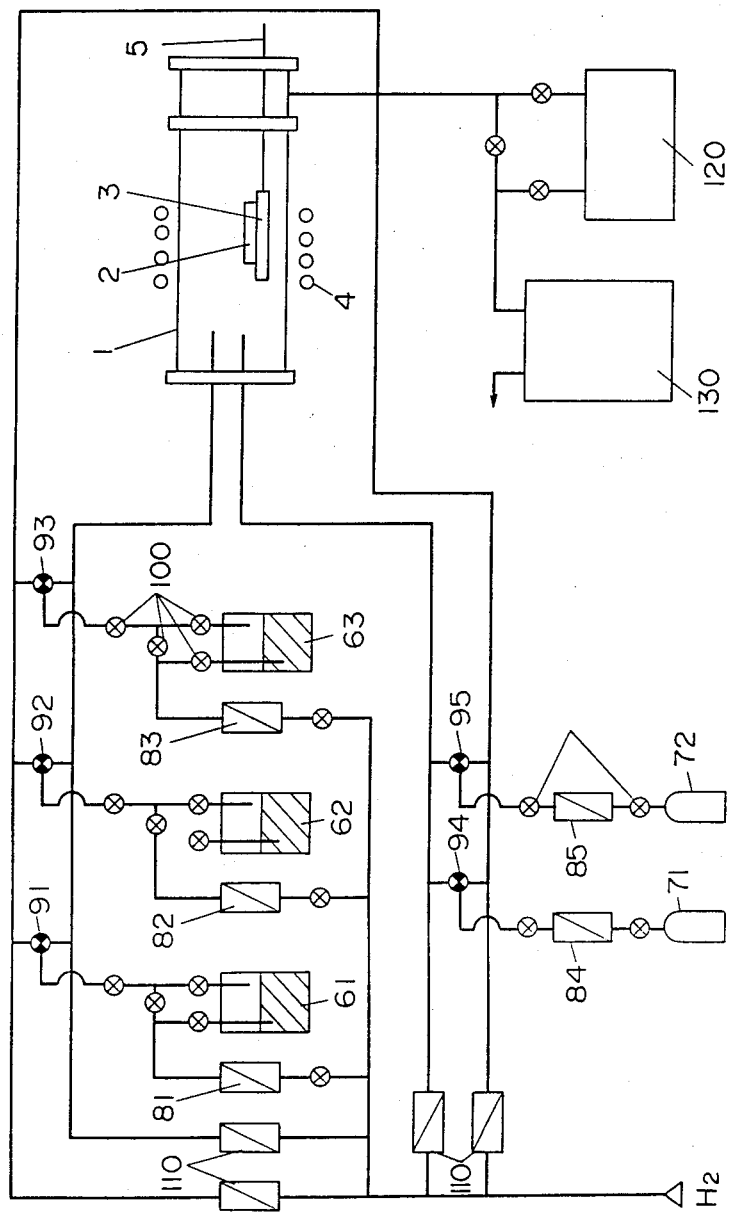
FIG. 7 shows schematically the gas piping of a conventional MOVPE apparatus.
Figure 8A:
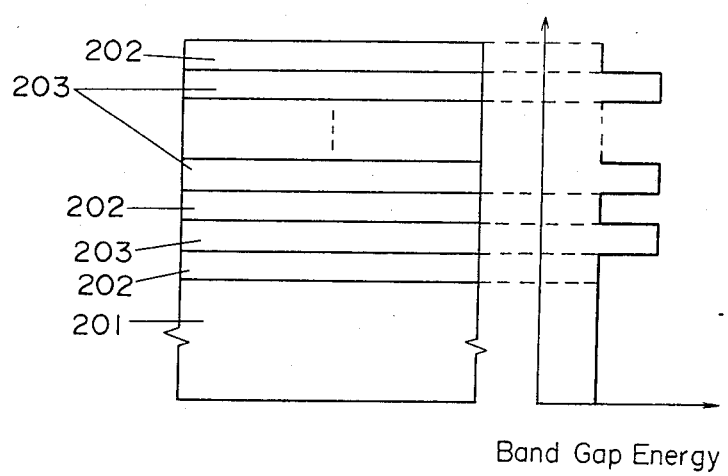
FIGS 8A, 8B show the schematic section and band structure of epitaxial layer possessing quantum well structure and graded band gap energy.
Figure 8B:
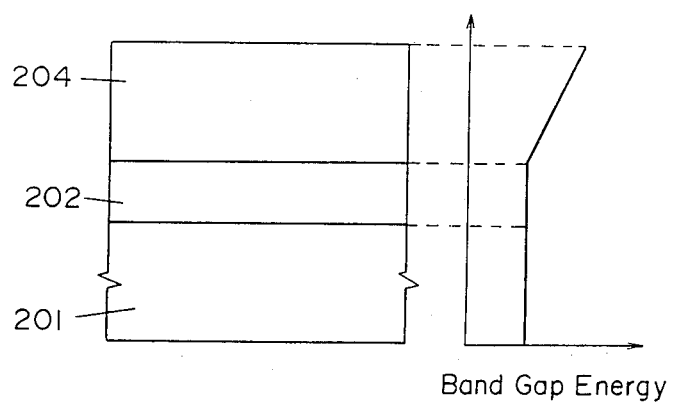

FIG. 1 shows the epitaxial growth apparatus used in this invention, that is, a schematic drawing near the epitaxial growth reactor of the photo-assisted MOVPE method, in which numeral 6 is a light incidence window, 7 is a desired pattern mask, 8 is a mirror, 9 is an excimer laser light, 10 is an excimer laser light source, and 11 is a hydrogen gas lead-in quartz tube for spraying the light incidence window, while other parts are identical as those in the conventional apparatus shown in FIG. 7. Although not shown in FIG. 1, the gas piping part is identical in structure with that in the conventional apparatus shown in FIG. 7. Thus, the epitaxial growth apparatus used in this invention has the means to irradiate the surface of the substrate 2 mounted on the carbon-made susceptor 3 in the epitaxial growth reactor 1 with laser light 9 through the light incidence window, and is also furnished with the hydrogen gas lead-in quartz tube 11 for spraying the light incidence window to prevent clouding of the light incidence window.

Below will be explained an application of this photo-assisted MOVPE apparatus to fabricate the GRIN-SCH (graded-index waveguide separate confinement heterostructure) structure shown in FIG. 2A, which is a kind of quantum well laser.

Its epitaxial growth processes are shown in FIGS. 3A to 3D. In this case, TMA, TMG, arsine were used, as the source gases of Al, Ga and As, respectively, in which dimethyl zinc (DMZ) and hydrogen sellenide were used, p- and n-type dopant gases, and $H_2$ was used as carrier gas. As the light source for irradiating the substrate, a KrF excimer laser (wavelength 249 nm) was used.

Figure 3A:
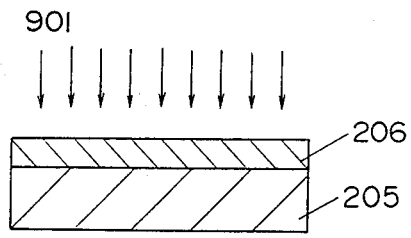
FIGS. 3A to 3B are sectional views showing the epitaxial growth processes of producing a quantum well layer structure in one of the embodiments of the invention.
Figure 3B:
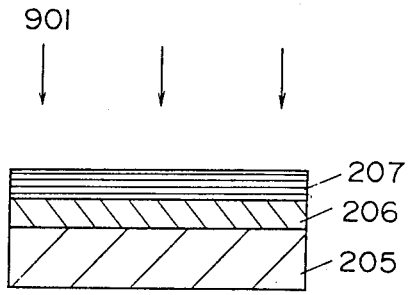
Figure 3C:
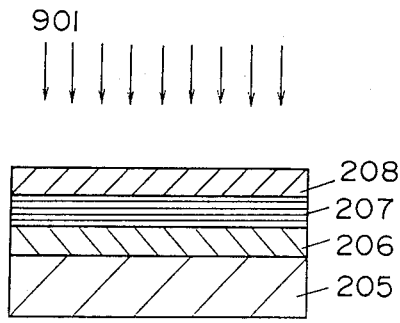
Figure 3D:
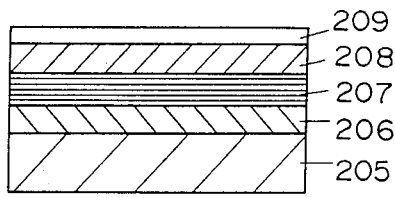

First, at a reduced pressure of 100 Torr, the temperature of the n-type GaAs substrate 205 mounted on the carbon-made susceptor 3 in the epitaxial growth reactor 1 was raised to a growth temperature of 700° C. by rf-induction. At this time, in order to prevent thermal damage of the GaAs substrate, arsine was supplied at 20 cc/min. Meanwhile, the flow rate of the source gases have been already made stationary at this moment. The flow rates of TMA, TMG, arsine, DMZ, and hydrogen sellinide were 0.25 cc/min, 0.28 cc/min, 20 cc/min, 0.02 cc/min and 0.016 cc/min, respectively. In the first step, while irradiating the whole surface of the n-type GaAs substrate 205 with a KrF excimer laser light 901 with an average power of 3 W/cm² in the perpendicular direction of the substrate surface, an n-type $Al_{0.6}Ga_{0.4}As$ clad layer 206 was grown in 1.5 μm (FIG. 3A). Next, a non-doped $Al_xGa_1As$ light confinement layer was grown in a thickness of 0.2 μm while gradually decreasing the average power of laser light 901 from 3 W/cm² to 0 W/cm². At this time, due to the decrease of the average power of laser light 901, the Al composition x changed from x=0.6 to x=0.3. Afterwards, a non-doped GaAs active layer 207 was grown in a thickness of 0.05 μm by stopping an introduction of TMA into the expitaxial growth reaction 1 (FIG. 3B). Next, a non-doped $Al_xGa_{1-x}as$ light confinement layer was grown in a thickness of 0.2 μm by introducing TMA again into the reaction 1 while gradually increasing the average power of the laser light 901 from 0 W/cm² to 3 W/cm². Next, a p-type $Al_{0.6}Ga_{0.4}As$ clad layer 208 in 1.5 μm were formed (FIG. 3C), and finally by stopping the supply of TMA into the reactor 1 and the laser light 901 irradiation, a p-type GaAs cap layer 209 was sequentially grown in a thickness of 1 μm (FIG. 3D).

After, quantum well laser of GRIN-SCH structure above p- and n-type electrodes were formed by an expitaxial growth process on the p-type GaAs cup layer 209 and an n-type GaAs substrate 205, respectively. The laser characteristics shows that with a minimum threshold current of 2.5 mA and an output laser power of 20 mW/facet, a quantum well effect with slight fluctuations in growth lots, and satisfactory reproducibility can be effected.

Figure 2A:
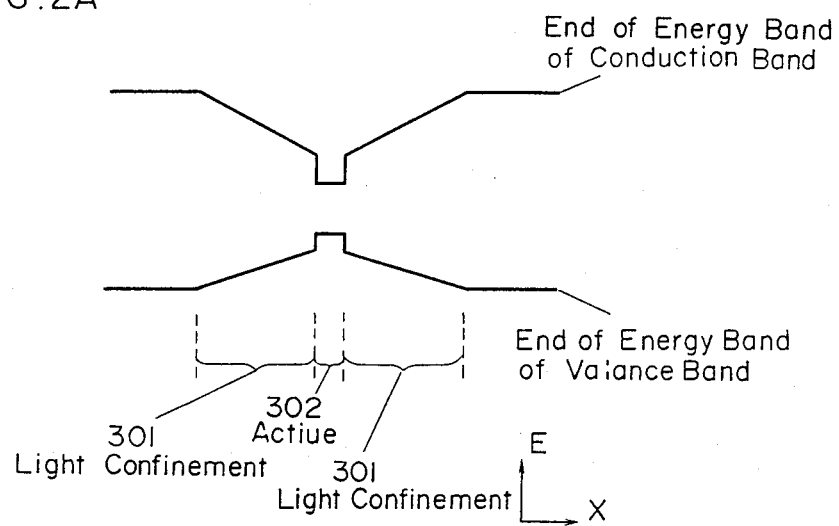
FIGS. 2A, 2B show the band structure of a quantum well laser possessng a GRIN-SCH structure.
Figure 2B:
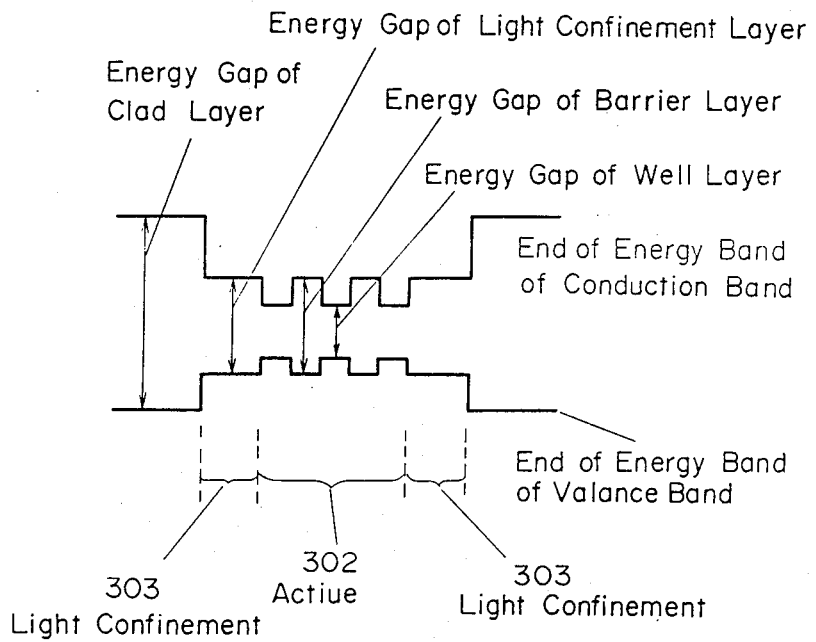

In the above embodiment, the composition change of the light confinement layer 301 of the GRIN-SCH structure shown in FIG. 2A was achieved by increasing and decreasing the average power of the KrF excimer laser light 901, but it is also possible to use in the formation of a quantum structure, with abrupt composition changes at the heterointerface between well and barrier layer shown in FIG. 2B by switching on and off the laser light irradiation. Furthermore, it is possible to vary the composition in a wider range by selecting the wavelength of laser light, improving the irradiation method and the epitaxial growth reactor 1, or by selecting the source gases with a higher decomposition rate by light irradiation. As a result, it is possible to achieve composition changes in a wider range in not only the light confinement layer 301 but also the active layer 302 with a quantum well structure.

The quantum well laser of this invention is a GRIN-SCH laser which has an active layer with a quantum well structure composed of thin films with various compositions, or a light confinement layer between the active layer and clad layer with a gradually varied composition. The quantum well structure and the light confinement layer are formed by irradiating the substrate with intermittent laser light and laser light whose intensity is changed continuously, respectively, during the vapor phase epitaxial growth. Therefore it is free from the problems caused by the changeover of the source gases and changes in the flow rate of the source gases, and designed composition changes can be realized at satisfactory reproducibility, so that the reproducibility and reliability of the characteristics of the quantum well laser fabricated can be enhanced, which may bring about excellent value of use and practical effects.

Referring now to FIG. 4, the appliction of this invention in the epitaxial growth process of an AlGaAs photo transistor structure with a graded bad gap energy is explained below. In this case, too, the photo-assisted MOVPE apparatus shown in FIG. 1 was used, and trimethyl aluminum [TMA; $Al(CH_3)_3$], trimethyl gallium [TMG; $Ga(CH_3)_3$], arsine ($AsH_3$) were used, as the source materials of Al, Ga, As, respectively, hydrogen sellinide ($H_2Se$) and dimethyl zinc [DMZn; $Zn(CH_3)_2$] were used, a n-type and p-type impurity materials, and hydrogen ($H_2$) was used as the carrier gas. A KrF excimer laser (wavelength: 249 nm) was used as the light source for irradiation. The flow rate of the source materials in each layer growth were as shown in the table below.

| Material | GaAs (collector layer) | $Al_xGa_{1-x}As$ $x \leq 0.2$ (base layer) | $Al_xGa_{1-x}As$ $x = 0.45$ (emitter layer) | $n^+$.GaAs (contact layer) |
|---|---|---|---|---|
| TMA | — | 0.02 | 0.1 | — |
| TMG | 0.4 | 0.38 | 0.3 | 0.4 |
| $AsH_3$ | 20 | 20 | 20 | 20 |
| $H_2Se$ | — | — | — | 0.02 |
| DMZn | — | 0.016 | — | — |

The total flow rate was 5 liters/min, and the pressure in the epitaxial growth reactor during growth was a reduced pressure of 100 Torr. The temperature of the substrate during growth was heated inductively to 750° C.

Figure 4A:
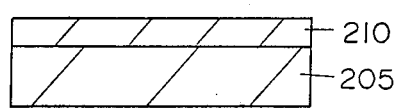
FIGS. 4A to 4E are sectional views showing the epitaxial growth processes of producing a photo transistor structure with a graded band gap energy in other embodiment of this invention.
Figure 4B:
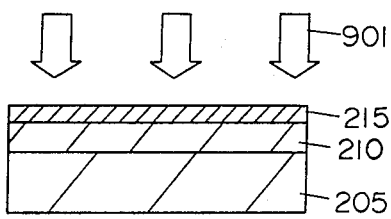
Figure 4C:
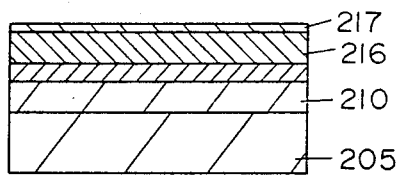
Figure 4D:
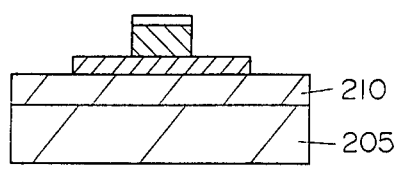

First, an n-type GaAs collector layer 210 was grown on an n-type GaAs substrate 205 in a thickness of 1.4 μm (FIG. 4A). Next, while irradiating the substrate with a KrF excimer laser light 901 with increasing average power, a p-type $Al_xGa_{1-x}As$ ($x \leq 0.2$) base layer 215 was grown in a thickness of 0.4 μm (FIG. 4B). The decomposition of TMA, the source material of Al, was enhanced by the irradiation of a laser light 901, and the Al composition x of the base layer increased up to 0.2 in proportion to the increase of the average power of laser light 901. Along with this change in composition, the energy band gap changed gradually. In this case, the average power of the laser light 901 was changed by gradually increasing the repetition rate in a range of 9 to 70 Hz, because of the pulse operation of an excimer laser, and the average power of laser light was changed to a maximum of 1.4 W/cm$^2$. Next, an n-type $Al_{0.45}Ga_{0.55}As$ emitter layer 216 was grown in a thickness of 1.4 μm by irradiating the substrate with a laser light having an average power of 1.4 W/cm$^2$, and then stopping laser light irradiation, an $n^+$-type GaAs contact layer 217 was grown in 0.05 μm in a thickness of succession (FIG. 4C).

Figure 4E:
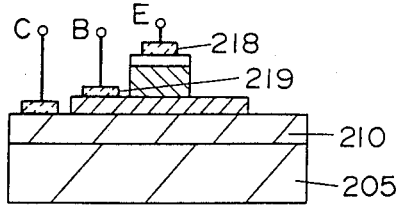

Afterwards, by sequentially and selectively etching the emitter layer 216 and base layer 215, part of the surface of the collector layer 210 and base layer 215 was exposed in order to form electrodes (FIG. 4D), and an n-type electrode 218 was formed on the surface of collector 210 and contact layer 217 which are composed of an n-type GaAs layer, and a p-type electrode 219 was formed on the surface of the base layer 215 (FIG. 4E).

According to the above manufacturing method, the band gap energy of the base layer 215 changes gradually from the band gap energy of 1.42 eV of the GaAs collector layer 210 to the 1.8 Ev of $Al_{0.2}Ga_{0.8}As$ emitter layer 216, and a base layer having a graded band gap energy can be formed at excellent controllability and reproducibility.

The response speed for light detection of the thus fabricated photo transistor with graded band gap was about 20 ps when the applied voltage was 0 V, and there was almost no difference in the device characteristics from the prior art.

This invention, hence, is capable of forming a base layer with graded band gap energy at excellent controllability and reproducibility by only varying the average power of laser light during light assisted vapor phase growth, so that fluctuations of device characteristics may be reduced.

This invention is further illustrated in FIG. 5, which shows the application into fabrication of an epitaxial layer structure of a GaAs/AlGaAs superlattice APD. The photo-assisted MOVPE used in this embodiment is same as that shown in FIG. 1. In this case, too, same source materials were used as said embodiment, but an ArF excimer laser light (wavelength 193 nm) was used as a light source. As shown in FIG. 5A, in the first place, an n-type GaAs buffer layer with a film thickness of 2 μm 210 was epitaxially grown on an n-type GaAs substrate 205 at the growth temperature ranging from 400° C. to 700° C., and at a TMG and AsHhd 3 flow rate of 0.4 sccm and 20 sccm. The carrier concentration of the buffer layer was about $5 \times 10^{18}$ cm$^{-3}$ by introducing $H_2Se$ into the reactor during growth. Next, a quantum well layer of undoped $Al_xGa_{1-x}As/Al_yGa_{1-y}As$ (x21 y) was formed. At this time, $Al_xGa_{1-x}As$ 211 was first epitaxially grown without light irradiation under the condition of TMG=0.32 cc/min, TMA=0.08 cc/min, and $AsH_3$=20 cc/min, and the growth temperature ranging from 400° to 700° C. as shown in FIG. 5B. The value of x, the film thickness and the carrier concentration of $Al_xGa_{1-x}as$ were about 0.1 to 0.2, 50 to 100 Å, and $10^{14}$ to $10^{15}$ cm$^{-3}$, respectively. In the next step, as shown in FIG. 5C, epitaxial growth of $Al_yGa_{1-y}As$ 212 was performed under the same growth conditions as shown in FIG. 5B while irradiating the substrate with an ArF excimer laser light 902 at about 12 W/cm$^{-2}$. The Al composition (y) of $Al_yGa_{1-y}As$ layer is about 0.4 to 0.5, and greater than that (x) of $Al_xGa_{1-x}As$ layer because of irradiation with an ArF excimer laser light 902. After forming a quantum well layer 213 by repeating the step of FIG. 5B, 5C 40 times each, a p-type GaAs layer 206 with a carrier concentration of $5 \times 10^{18}$ cm$^{-3}$ and a film thickness of 2 μm was grown, as shown in FIG. 5B by introducing dimethyl zinc (DMZ) under the growth conditions shown in FIG. 5A. Afterwards, as shown in FIG. 5E, an electrode 214 was formed. As a result, an APD with a superlattice structure was obtained.

Deterioration of the abruptness at the heterointerface due to the memory effect of source gases, may be restricted by this invention, when forming a quantum well. It is considered that the superlattice-type APD has better characteristics than the bulk-type APD, because the ionization coefficient ratio in GaAs/AlGaAs superlattice is increased as compared with that of bulk GaAs or AlGaAs, which is caused by a considerable difference of energy between the electrons and holes in the degree of discontinuity of the band gap energy edge at the heterointerface of the multi quantum well layer. Therefore, since the abruptness at the heterointerface is improved by supressing the memory effect of source gases, the discontinuity of band gap energy edge at the heterointerface becomes abrupt, following that excellent characteristics of APD are obtained.

The heterointerface in the superlattice APD becomes abrupt, by employing the manufacturing method of this invention, because the memory effect of the os source gases is suppressed. Therefore, when a high electric field is applied to the quantum well layer, that is, when operating the APD, the ionization coefficient of about 10 for the electrons and holes is obtained, so that an APD with superior characteristics may be obtained.

Figure 6A:
FIGS. 6A and 6C are sectional views showing the epitaxial growth processes of producing a HEMT structure in a still different embodiment of this invention.
Figure 6B:
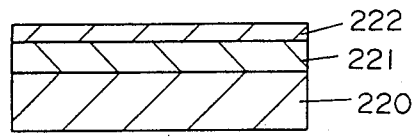
Figure 6C:
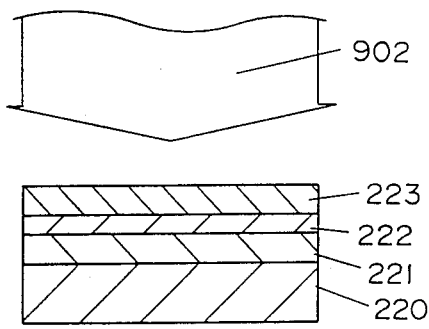

The next description refers to the application of this invention to the epitaxial growth of an AlGaAs/GaAs HEMT (high electron mobility transistor) structure. The epitaxial growth processes of this application are shown in FIG. 6. The apparatus used in this growth was same as that in FIG. 1, and Al(CH$_3$)hd 3, GA(CH$_3$)$_3$, AsH$_3$ were used, as the source materials of Al and GaAs, respectively and Si(CH$_3$)$_4$ was used, as the n-type impurity material, and H$_2$ was used as the carrier. ArF excimer laser light (wavelength 193 nm) was used, as the light source for irradiating the substrate.

First, the temperature of the semi-insulating GaAs substrate 220 mounted on a carbon-made susceptor 3 in an epitaxial growth reactor 1 was raised to a growth temperature of 750° C. by rf induction. At this time, in order to prevent thermal damage of the surface of the GaAs substrate 220, AsH$_3$ was supplied at a flow rate of 20 cc/min. Afterwards, a an HEMT structure was formed by growing in the sequence of FIG. 6A, 6B, 6C. In this case, the growth conditions were as shown in the table below.

|   | Ga(CH$_3$)$_3$ (sccm) | Al(CH$_3$)$_3$ (sccm) | AsH$_3$ (sccm) | Si(CH$_3$)$_4$ (sccm) |
| --- | --- | --- | --- | --- |
| (1) Non-doped GaAs layer | 0.4 | — | 20 | — |
| (2) Non-doped AlGaAs layer |  | 20 |  | — |
| (3) n-type AlGaAs layer |  |  | 20 |  |

Figure 5A:
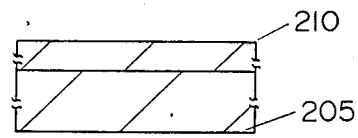
FIGS. 5A to 5E are sectional views showing the epitaxial growth processes of producing a photo detector structure with multi-quantum layer in a different embodiment of this invention.
Figure 5B:
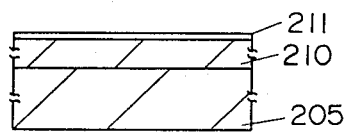
Figure 5C:
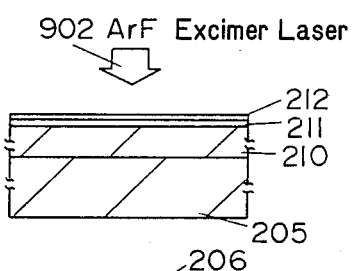
Figure 5D:
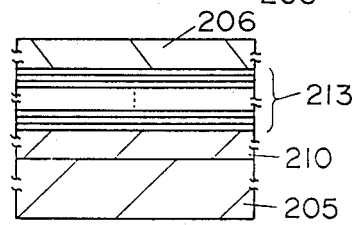
Figure 5E:
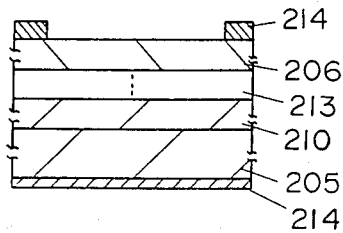

The total flow rate was 5 liter/min, and the reactor pressure during growth was 100 Torr. Besides, as mentioned above, in the case of an n-type $Al_xGa_{1-x}As$ layer growth, as shown in FIG. 5C, the entire surface of the substrate was irradiated with an ArF excimer laser 902 with an average power of 1.5 W/cm$^2$, in the direction perpendicular to the substrate surface, simultaneously with the start of the supply of an n-type impurity material Si(CH$_3$)$_4$.

As a result, the concentration of Si, an n-type impurity, changed abruptly at the interface between the non-doped $Al_xGa_{1-x}As$ layer and the n-type $Al_xGa_{1-x}As$ layer, and a two-dimensional electron gas with high concentration was able to be formed in the non-doped GaAs layer.

The method of fabrication of a field effect transistor having a heterojunction structure according to this invention is to irradiate the substrate surface with a laser light simultaneously with the start of supply of the n-type impurity material having a large photodecomposition efficiency, at the time of the epitaxial growth of the selectively doped semiconductor layer. That is, decomposition of the n-type impurity material is controlled by light irradiation.

Therefore, the n-type impurity concentration increases dramatically at the interface between the selectivity doped layer and non-doped layer, and as a result, the concentration of the two-dimensional electron gas increases more than in the prior art. This leads to a faster speed of operation of the field effect transistor having a heterojunction structure, and the value of use and practical effect of this invention are very great.

The above embodiments, meanwhile, referred only to the photo-assisted MOVPE method, but this invention may also be realized in the photo-assisted molecular beam epitaxy (MBE) method, the photo-assisted metal organic molecular beam epitaxy (MOMBE) method, or the photo-assisted vapor phase epitaxy (VPE) method. As the light source for irradiation, KrF and ArF excimer laser lights were used, but this invention may be also realized by using other excimer laser lights than KrF and ArF, such as XeF, or an Ar laser light, a CO$_2$ laser, an He-Cd laser, a YAG laser, etc. Also the above embodiments referred to the AlGaAs/GaAs compound semiconductor device structures, but this invention can be used not only in fabrication of various device structure using InP/InGaAs, AlGaInP/GaAs, InAlAs/InGaAs or other III-V group compound semiconductors, but also in the fabrication of various devices structures using a II-VI group and chalcopyrite compound semiconductor or various device structures combining III-V group and II-VI group compound semiconductors.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A method for producing a compound semiconductor multilayer structure by vapor phase growth comprising the steps of:
   continuously supplying and maintaining compound gases during the growth of each layer, each of said gases consisting of at least a constituent element of epitaxial layers to be grown on a surface of a substrate heated to a desired growth temperature;
   growing a first compound epitaxial layer on said surface of said substrate by irradiating said surface of said substrate with light having a predetermined intensity;
   growing a second compound epitaxial layer on a surface of said first compound epitaxial layer by irradiating the said surface of said first compound epitaxial layer with light while gradually increasing or decreasing the intensity of said light or by switching on and off said light whereby the composition of the said second compound epitaxial layer changes abruptly or continuously during growth.

2. A method of claim 1, wherein one of said first and second predetermined intensities is zero.

3. A method of claim 1, wherein said compound gases are selected from organo-metallic compounds, hybrides, and chlorides.

4. A method of claim 1, wherein a light source used for said irradiations is at least one of an excimer laser, an Ar laser, a $Co_2$ laser, an ultraviolet lamp, an He-Cd laser and a YAG laser.

* * * * *